(12) United States Patent
Humla

(10) Patent No.: US 9,229,063 B2
(45) Date of Patent: Jan. 5, 2016

(54) METHOD, ARRANGEMENT AND COMPUTER PROGRAM PRODUCT FOR DETERMINING AN END-OF-LIFE STATE OF A BATTERY

(75) Inventor: Lars Humla, Hässelby (SE)

(73) Assignee: Telefonaktiebolaget L M Ericsson (Publ), Stockholm (SE)

(*) Notice: Subject to any disclaimer, the term of this patent is extended or adjusted under 35 U.S.C. 154(b) by 711 days.

(21) Appl. No.: 13/498,197

(22) PCT Filed: Mar. 15, 2012

(86) PCT No.: PCT/SE2012/050283
§ 371 (c)(1), (2), (4) Date: Apr. 24, 2012

(87) PCT Pub. No.: WO2013/095249
PCT Pub. Date: Jun. 27, 2013

(65) Prior Publication Data
US 2013/0158915 A1 Jun. 20, 2013

Related U.S. Application Data

(60) Provisional application No. 61/577,806, filed on Dec. 20, 2011.

(51) Int. Cl.
G06F 19/00 (2011.01)
G01R 19/00 (2006.01)
G01R 31/36 (2006.01)

(52) U.S. Cl.
CPC ........ *G01R 31/3679* (2013.01); *G01R 31/3634* (2013.01); *G01R 31/3627* (2013.01); *G01R 31/3648* (2013.01)

(58) Field of Classification Search
CPC ............. G01R 19/00; G01R 19/16543; G01R 31/3651; G01R 31/3679; G01R 31/3606; G01R 31/3631; G01R 31/3634; G01R 31/3627; G01R 31/3648
USPC ........................................................... 702/63
See application file for complete search history.

(56) References Cited

U.S. PATENT DOCUMENTS 5,830,595 A * 11/1998 Song ............................ 429/92
7,429,849 B2 * 9/2008 Shoji ........................... 320/150

(Continued)

FOREIGN PATENT DOCUMENTS

WO 0221149 A2 3/2002

OTHER PUBLICATIONS

IBM. "Dynamic Rechargeable Battery End-of-Life Prediction." 700 IBM Technical Disclosure Bulletin, Jun. 1, 1986, pp. 352-356, vol. 29, No. 1, Armonk, New York, United States of America.
Morling, M.A. "Enhanced Continuous Battery Monitoring." 24th International Telecommunications Energy Conference Intelec 2002, Sep. 29-Oct. 3, 2002, pp. 574-577, Montreal, Canada.

(Continued)

*Primary Examiner* — John Breene
*Assistant Examiner* — Lynda Dinh
(74) *Attorney, Agent, or Firm* — Patent Portfolio Builders, PLLC

(57) ABSTRACT

Techniques for determining an end-of-life state of a battery. During a discharge a first discharge voltage value $U_1(T_1)$ provided by the battery at a first point of time $T_1$ and a second discharge voltage value $U_2(T_2)$ provided by the battery at a second point of time $T_2$ are measured. A predicted backup time $T_{predicted}$ is computed based on the measured values and the first and second points in time. Furthermore, during the discharge, a plurality of discharge current values at a plurality of points of time on or between the first point of time $T_1$ and the second point of time $T_2$ are measured, and an average discharge current, $I_{average}$, is computed. An expected backup time $T_{expected}$ is then computed based on the initial capacity of the battery and $I_{average}$. If $T_{expected}$ is less than or equal to $T_{predicted}$ then the EOL state of the battery is determined.

12 Claims, 3 Drawing Sheets

(56) References Cited

U.S. PATENT DOCUMENTS

| | | |
|---|---|---|
| 7,880,438 B1 | 2/2011 | Cohen et al. |
| 8,010,167 B2* | 8/2011 | Cotevino et al. ............. 455/574 |
| 2003/0065366 A1 | 4/2003 | Merritt et al. |
| 2009/0167543 A1* | 7/2009 | Bi .............................. 340/636.1 |
| 2011/0029265 A1* | 2/2011 | Martens ......................... 702/63 |

OTHER PUBLICATIONS

Pascoe, P.E et al. "Standby VRLA Battery Reserve Life Estimation." 26th International Telecommunications Energy Conference Intelec 2004, Sep. 19-23, 2004, pp. 516-523, Chicago, United States of America.

* cited by examiner

METHOD, ARRANGEMENT AND COMPUTER PROGRAM PRODUCT FOR DETERMINING AN END-OF-LIFE STATE OF A BATTERY

TECHNICAL FIELD

The present disclosure relates to a method, an arrangement and a computer program product for determining an end-of-life state of a battery.

BACKGROUND

The valve regulated lead acid (VRLA) battery is used extensively throughout the telecommunications industry as a backup energy storage source. Typically, the battery is the only backup energy source in such applications and, thus, the last line of defense against system failure in the event of AC mains failure.

Battery capacity, the energy storage capability, has long been a target of researchers as a definitive battery state of health (SOH) indicator. Conventional standards, such as "IEEE Recommended Practices for Maintenance, Testing and Replacement of Valve Regulated Lead Acid (VRLA) Batteries in Stationary Applications," IEEE STD 1188-1996, base criteria for determining end of battery operational life on capacity. Typically, when the capacity reaches 80% of the manufacturer's rated capacity, the battery is deemed to be at the end of its operational life.

If the battery fails, the operational security of the telecommunications system is in jeopardy.

A widely accepted method for obtaining an accurate measurement of capacity is to fully discharge the battery. This is time consuming and expensive and leaves the telecommunication system vulnerable to AC mains failure until the battery is fully recharged after the measurement.

U.S. Pat. No. 7,880,438 B1 describes a technique for estimating an uninterruptible power supply battery's capacity. The battery is periodically subjected to a partial-discharge test by using the battery to power a fixed load for a fraction of the theoretical runtime of the battery. Measurements of the battery's voltage are made at various times during the testing. The battery is discharged into a load for substantially less time than to fully discharge the battery. During discharge, first and second voltage values provided by the battery at first and second times are determined. The first and second voltage values are then used to extrapolate a future voltage decrease of the battery to make a first determination of a predicted runtime of the battery.

If the capacity is below a desired level, or if the battery voltage drops below a threshold voltage during the testing, then further testing of the battery is preferably performed after recharging the battery. The same test can be repeated or another test can be performed where the battery is used to power the load for a larger fraction of the theoretical runtime of the battery. If the battery voltage drops below the threshold and/or the estimated capacity is lower than desired in the further testing, then the battery can be determined to be bad, a notification to this effect provided and the battery can be replaced.

As the battery during the partial-discharge test of U.S. Pat. No. 7,880,438 B1 is connected to a fixed load, the discharge current is constant during the time period of the partial-discharge test. When the battery is used as a power supply for the telecommunication equipment in the event of AC mains failure, however, the load and, thus, also the discharge current varies. The capacity of a battery is not constant but depends on the discharge current. In general, a battery has a higher capacity when discharged with a low discharge current than with a higher discharge current. The method suggested in U.S. Pat. No. 7,880,438 B1 is therefore not applicable to a system with variable load conditions.

SUMMARY

It is therefore an object of the present invention to more reliably determine an end-of-life (EOL) state of a battery even when the load of the system to be powered by the battery varies.

According to a first aspect, this object is achieved by a method for determining an end-of-life, EOL, state of a battery, the battery having an initial capacity $C_{ini}$. The method comprises during a discharge measuring a first discharge voltage value $U_1(T_1)$ provided by the battery at a first point of time $T_1$ and measuring a second discharge voltage value $U_2(T_2)$ provided by the battery at a second point of time $T_2$. A predicted backup time is computed based one the measured values of $U_1(T_1)$ and $U_2(T_2)$ and on the first and second point in time $T_1$, $T_2$.

The method further comprises during the discharge measuring a plurality of discharge current values at a plurality of points of time on or between the first point of time $T_1$ and the second point of time $T_2$ and computing an average discharge current, $I_{average}$, from the plurality of discharge current values. An expected backup time $T_{expected}$ is then computed based on the initial capacity of the battery $C_{ini}$ and $I_{average}$. The method further comprises the comparison of the determined values for $T_{expected}$ and $T_{predicted}$. $T_{expected} \leq T_{predicted}$ then the EOL state of the battery is determined.

According to a second aspect, the above-mentioned object is achieved by an arrangement for determining an end-of-life, EOL, state of a battery, the battery having an initial capacity $C_{ini}$. The arrangement comprises a measuring part configured to measure a first discharge voltage value $U_1(T_1)$ provided by the battery at a first point of time $T_1$ and a second discharge voltage value $U_2(T_2)$ provided by the battery at a second point of time $T_2$ and a processing circuit configured to compute a predicted backup time, $T_{predicted}$ based on $T_1$, $T_2$, $U_1(T_1)$ and $U_2(T_2)$. The measuring part is further configured to measure a plurality of discharge current values at a plurality of points of time on or between the first point of time $T_1$ and the second point of time $T_2$. The processing circuit is further configured to compute an average discharge current, $I_{average}$, from the plurality of discharge current values, to compute an expected backup time $T_{expected}$ based on the initial capacity of the battery $C_{ini}$ and $I_{average}$ and to compare $T_{expected}$ and $T_{predicted}$. If $T_{expected} \leq T_{predicted}$ then the processing circuit is configured to determine the EOL state of the battery.

According to a third aspect, the above-mentioned object is achieved by a computer program product for A computer program product for determining an end-of-life, EOL, state of a battery, the battery having an initial capacity $C_{ini}$, the computer program product comprising computer program segments that, when run on a computer, cause the computer to compute a predicted backup time, $T_{predicted}$ based on measured values of a first discharge voltage $U_1(T_1)$ provided by the battery at a first point of time $T_1$ a second discharge voltage $U_2(T_2)$ provided by the battery at a second point of time $T_2$, compute an average discharge current, $I_{average}$, from a plurality of measured discharge current values and compute an expected backup time $T_{expected}$ based on the initial capacity of the battery $C_{ini}$ and $I_{average}$. Furthermore, the computer is caused to compare $T_{expected}$ and $T_{predicted}$ and to determine the EOL state of the battery if $T_{expected} \leq T_{predicted}$.

Other objects, advantages and novel features will become apparent from the following detailed description of the present method and arrangement.

BRIEF DESCRIPTION OF THE DRAWINGS

The methods and arrangements are described in more detail with reference to attached drawings illustrating exemplary embodiments in which.

DETAILED DESCRIPTION

Embodiments herein are defined as a method, an arrangement and a computer program product for determining the EOL state of a battery, which may be put into practice in the embodiments described below. These embodiments may, however, be exemplified and realised in many different forms and are not to be considered as limited to the embodiments set forth herein; rather, these embodiments are provided so that this disclosure will be thorough and complete.

Still other objects and features may become apparent from the following detailed description considered in conjunction with the accompanying drawings. It is to be understood, however, that the drawings are designed solely for purposes of illustration and not as a definition of the limits of the herein disclosed embodiments, for which reference is to be made to the appended claims. It is further to be understood that the drawings are not necessarily drawn to scale and that, unless otherwise indicated, they are merely intended to conceptually illustrate the structures and procedures described herein.

Figure 1:
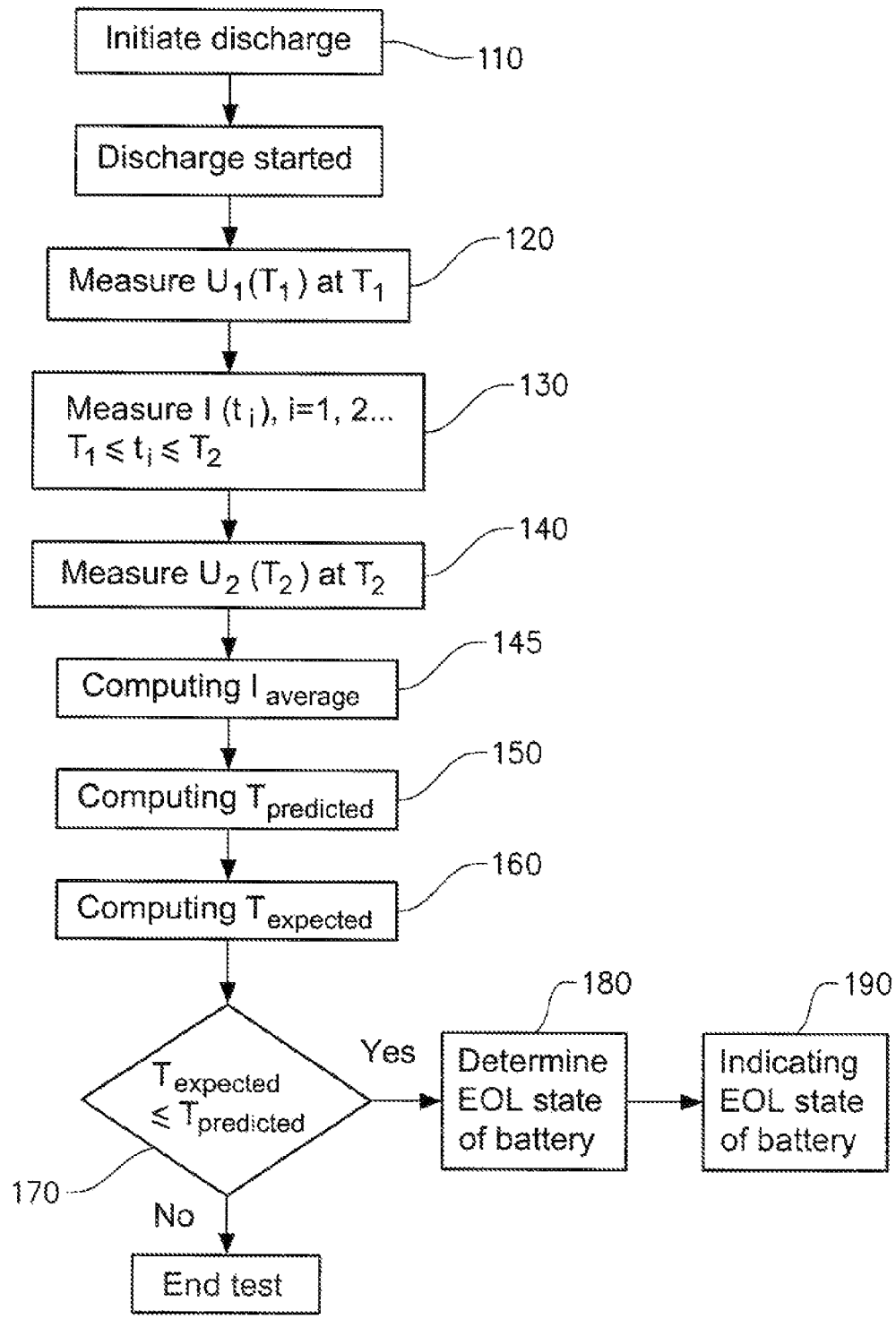
FIG. 1 is a flowchart illustrating embodiments of method steps.

FIG. 1 depicts a method for determining an EOL state of a battery. Such a battery may be used in telecommunications equipment, e.g. in a radio base station, a base transceiver station, a NodeB or a radio network controller, in order to supply energy to the equipment in the event of AC mains failure. In order to secure the operation of the equipment when AC mains fail it is important for an operator of the equipment, e.g. a telecommunications operator, to be able to reliably determine when the battery has reached an EOL state in order to be able to take appropriate measures.

The method as shown in FIG. 1 may be performed during a discharge caused by AC mains failure, when the battery is discharged while powering the connected equipment, e.g. the telecommunications equipment. Alternatively the method may be performed after initiating (110) a discharge for testing the battery.

During the discharge, a first discharge voltage value $U_1(T_1)$ provided by the battery at a first point of time $T_1$ is measured (120) and a second discharge voltage value $U_2(T_2)$ provided by the battery at a second point of time $T_2$ (140) is also measured. Additionally, during the discharge at least two discharge current values are measured (130) at at least two different points of time on or between the first point of time $T_1$ and the second point of time $T_2$ are measured. Although the measurement of two different discharge currents is sufficient to perform the described method, preferably more than two discharge current values are measured at different points of time on or between the first point of time and the second point of time. With additional discharge current measurements the reliability of the EOL state determination may be further increased. Preferably the first point of time $T_1$ is chosen directly or very shortly after the start of the discharge, while the second point of time $T_2$ is preferably chosen when the battery is discharged more than 25%. Based on the measured current discharge values, an average discharge current value $I_{average}$ is then determined by computing (145) the measured current discharge values.

The method further comprises computing (150) the predicted backup time. The computation of the predicted backup time is in general based on the speed of the drop of battery voltage down to a minimum voltage level. According to a preferred embodiment, computing the predicted backup time $T_{predicted}$ comprises extrapolation of voltage over time values based on the first and the second discharge voltage value $U_1(T_1)$, $U_2(T_2)$ and the first and second point in time $T_1$, $T_2$. The predicted backup time $T_{predicted}$ is then calculated as the point in time t when the voltage $U(t)$ is equal to a minimum voltage $U_{min}$. Preferably linear extrapolation is used for computing the predicted backup time, although also other types of extrapolation, e.g. polynomial or conic extrapolation may be suitable for computing the predicted backup time. According to a preferred embodiment, $U_{min}$ is 80% of $U_1$, i.e.

$$U_{min}=0.8*U_1. \tag{1}$$

Alternatively, $U_{,min}$ may also be determined by defining a lowest acceptable voltage value delivered by the battery, i.e. $U_{min}$ may be defined independently of $U_1$ or $U_2$. Furthermore, another minimum voltage value $U_{min}$ may be defined in dependency of the first discharge value $U_1$, the second discharge value $U_2$ or an average voltage value determined over the period of time between the first and the second point of time $T_1$, $T_2$, e.g. 60%, 70% or 90% of these values.

Figure 3:
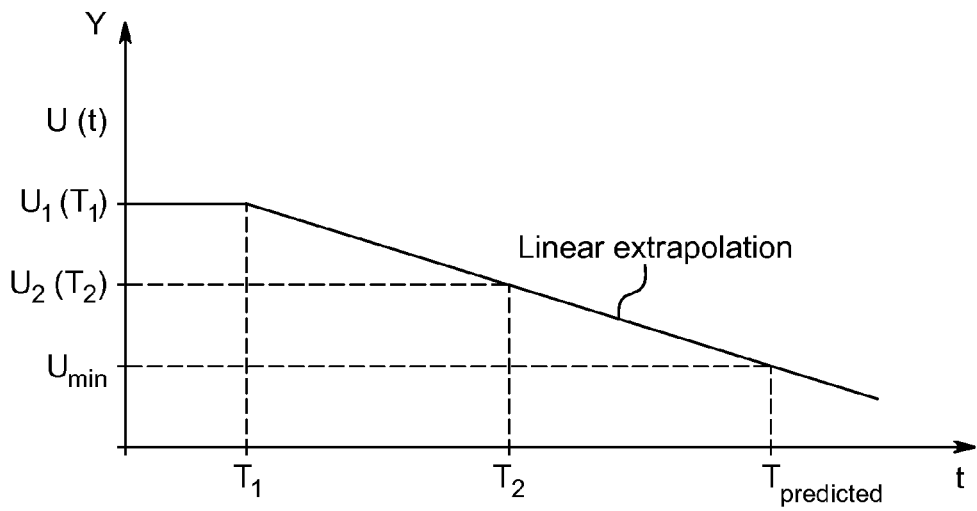
FIG. 3 is a diagram illustrating a discharge voltage—time curve and a determination of the predicted backup time.

FIG. 3 illustrates a general example of linear extrapolation for computing the predicted backup time. Based on the voltage drop between the first point in time $T_1$ and the second point in time $T_2$ the point in time is determined when the voltage will reach a predefined minimum value $U_{,min}$. This point in time is the predicted backup time. When determining the predicted backup time using linear extrapolation, it is presumed that the voltage drop over time follows a linear curve.

Referring back to FIG. 1, the method further comprises computing (160) the expected backup time $T_{expected}$. In contrast to the predicted backup time, the expected backup time is computed based on an average discharge current and an installed battery capacity. With these input variables, a remaining battery capacity $C_{remain}$ after a discharge can be computed. When the expected backup time is computed, it is always presumed that the battery has full capacity without any aging degradation. Aging degradation may be considered by an aging factor k.

The expected backup time is preferably computed as follows:

1) calculating a discharged capacity $C_{measured}$ according to $$C_{measured}=I_{average}*(T_2-T_1) \tag{2}$$

2) calculating an actual capacity of the battery $C_{actual}$ before the discharge based on the initial capacity $C_{ini}$ and the average discharge current $I_{average}$ The initial capacity may be the installed battery capacity value given by the manufacturer of the battery. In this case it is assumed that initial capacity is equal to the nominal capacity.

Alternatively, the initial capacity $C_{ini}$ may be measured, when the battery is fully charged or assumed to be fully charged.

According to a preferred embodiment, a measured initial capacity, $C_{ini,measured}$ shall be recalculated to nominal capacity by taking into consideration the average discharge current, $I_{Average}$ as follows in (3):

$$C_{Nom}=C_{ini}*100/(0.002*I_{Average}^2-0.6628*I_{Average}+105.21) \quad (3)$$

The nominal capacity may be set equivalent to the initial capacity of the battery. The initial capacity of the battery is either the capacity value given by the manufacturer of the battery. Alternatively, the initial capacity may be measured during a complete discharge test.

Alternatively, the nominal capacity is calculated based on the initial capacity, whereby a correction of the initial capacity based on the load conditions during discharge is made.

The actual capacity is then calculated by (4):

$$C_{Actual}=C_{Nom}*(0.002*(I_{Average})^2-0.6628*I_{Average}+105.21)/100 \quad (4)$$

3) calculating a remaining capacity $C_{remain}$ after discharge according to $$C_{remain}=C_{actual}-C_{measured}. \quad (5)$$

The expected backup time may then be calculated as $$T_{expected}=T_2+(C_{remain}/I_{average}). \quad (6)$$

In an alternative embodiment of this method, the age of the battery is taken into consideration when the expected backup time is computed. The expected backup time is then instead of using equation (6) calculated as $$T_{expected}=(T_2+(C_{remain}/I_{average}))*k, \quad (7)$$

whereby k is an aging factor indicating the age of the battery.

The method further comprises a comparison (170) of the computed expected backup time $T_{expected}$ and the computed predicted backup time $T_{predicted}$. If the predicted backup time value is equal or higher than the expected backup time then an End-of-Life state of the battery is determined (180). Additionally, an indication of the determined End-of-Life state may be provided (190), e.g. by providing a visual or acoustic signal to an operator.

If the predicted backup time value $T_{predicted}$ is lower than the expected backup time $T_{expected}$, then no further actions need to be taken, and the method is finished.

Figure 2:
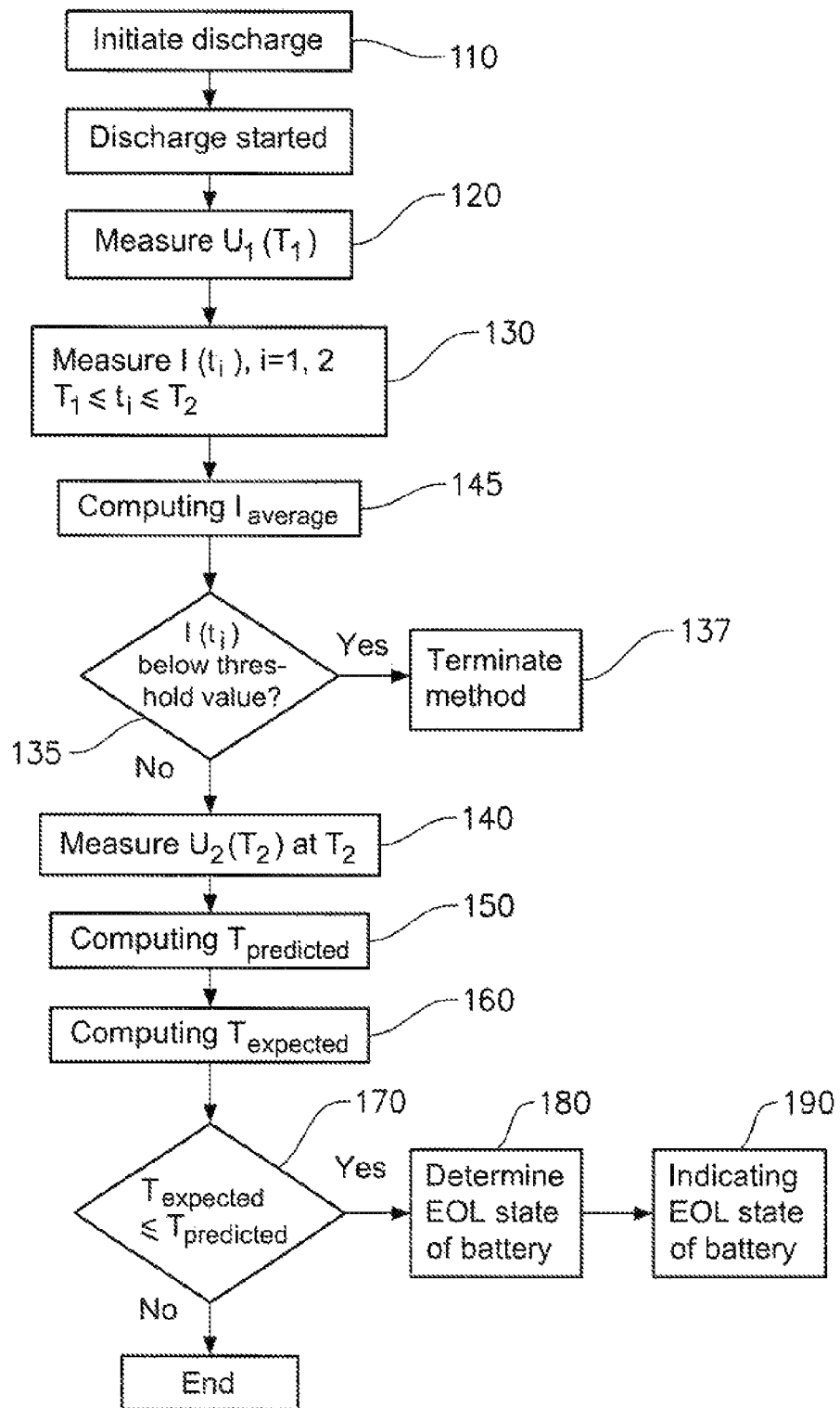
FIG. 2 is a flowchart illustrating embodiments of method steps.

FIG. 2 illustrates the method as described in FIG. 1 but comprising an additional step of comparing (135) at least one of the measured current values $I(t_i)$ with a predefined discharge current threshold value. If the discharge current for any, or alternatively all of the measured current values is below a discharge current threshold value then the method shall be terminated in order to avoid measurement inaccuracy. Alternatively the average discharge current $I_{average}$ may be compared to the discharge current threshold value. If the average discharge current $I_{average}$ is below the discharge current threshold value then the method is terminated. According to a preferred embodiment, the discharge current threshold value is +/−3 Ampere. Alternatively, other discharge current threshold values for terminating the method may be defined.

Preferably, the method is started after a time period of 15 minutes or more after a discharge has started. Such a delay in starting the method may result in a more reliable outcome of the method due to the Coup de fouet.

Figure 4:
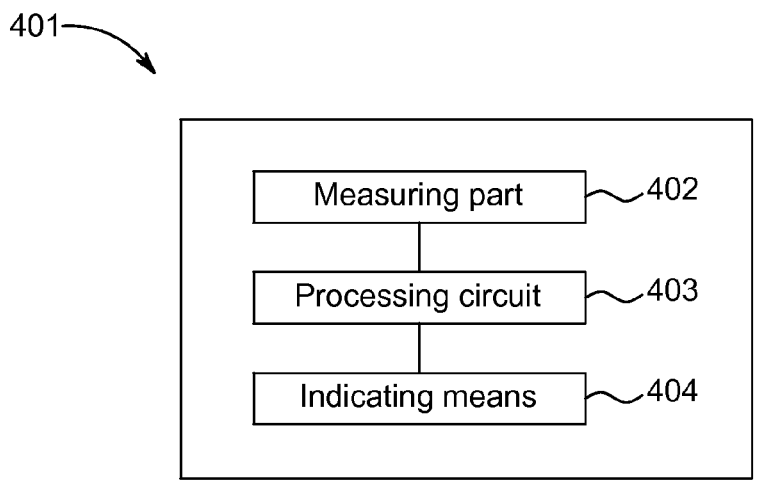
FIG. 4 is a block diagram illustrating an embodiment of an arrangement for determining an end-of-life state of a battery.

FIG. 4 illustrates an arrangement (401) for determining an end-of-life state of a battery. The arrangement may be part of a network node of a telecommunication system, e.g. base transceiver station, a radio base station, a NodeB or an eNodeB, a base station controller or a radio network controller. Alternatively, the arrangement may be separate and connectable to a network node of a telecommunication system. The arrangement is, however, not limited to the use in the telecommunication industry but may also be used in other fields of technology to give a reliable determination and indication of an end-of-life state of a battery.

The arrangement (401) comprises a measuring part (402) and a processing circuit (403). The measuring part (402) is configured to measure a first discharge voltage value $U_1(T_1)$ provided by the battery at a first point of time $T_1$ and a second discharge voltage value $U_2(T_2)$ provided by the battery at a second point of time $T_2$. Equipment for voltage and current measurement is generally know and therefore not described in detail. The processing circuit (403) is configured to compute a predicted backup time, $T_{predicted}$ based on $T_1$, $T_2$, $U_1(T_1)$ and $U_2(T_2)$. The processing circuit is further configured to compute an average discharge current, $I_{average}$, from the plurality of discharge current values, compute an expected backup time $t_{expected}$ based on the initial capacity of the battery $C_{ini}$ and $I_{average}$, compare $T_{expected}$ and $T_{predicted}$ and , if $T_{expected} \leq T_{predicted}$, determine the EOL state of the battery.

The processing unit may be one or a combination of a CPU, a printed circuit board, a microprocessor or an integrated circuit.

According to a preferred embodiment and as illustrated in FIG. 4, the arrangement may comprise indicating means (404) for indicating an end-of-life state of a battery. The indicating means may be configured to give a visual alarm indication, e.g. by using a light emitting diode, LED, and/or an audible alarm indication to an operator, when an end-of-life status of a battery is determined.

In order to execute a method for determining an end-of-life state of a battery, a computer program product comprising computer program segments may be provided. When run on a computer, the computer program segments cause the computer to compute a predicted backup time, $T_{predicted}$ based on measured values of a first discharge voltage $U_1(T_1)$ provided by the battery at a first point of time $T_1$ a second discharge voltage $U_2(T_2)$ provided by the battery at a second point of time $T_2$, Compute an average discharge current, $I_{average}$, from a plurality of measured discharge current values, compute an expected backup time $T_{expected}$ based on the initial capacity of the battery $C_{ini}$ and $I_{average}$, compare $T_{expected}$ and $T_{predicted}$ and if $T_{expected} \leq T_{predicted}$ determine the EOL state of the battery.

Preferably the computer program product further comprises computer program segments that, when run on a computer, cause the computer to give an indication of an end-of-life state of the battery, e.g. a visual or audible indication.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfill the functions of several units recited in the claims. Any reference signs in the claims shall not be construed so as to limit their scope.

The invention claimed is:

1. A method for determining an end-of-life (EOL) state of a battery, the battery having an initial capacity, the method comprising:

during a discharge of the battery, measuring, by a measuring circuit, a first discharge voltage value provided by the battery at a first point of time;

during the discharge, measuring, by the measuring circuit, a second discharge voltage value provided by the battery at a second point of time $T_2$;

computing, by a processing circuit, a predicted backup time that the battery can support, based on the first and second discharge voltage values and the first and second points of time;

during the discharge, measuring, by the measuring circuit, a plurality of discharge current values at a plurality of points of time on or between the first point of time and the second point of time;

computing, by the processing circuit, an average discharge current from the plurality of discharge current values;

calculating, by the processing circuit, a discharged capacity by multiplying the average discharge current by a difference between the second and first points in time;

calculating, by the processing circuit, an actual capacity of the battery before the discharge, based on the initial capacity and the average discharge current;

calculating, by the processing circuit, a remaining capacity after discharge according to a difference between the actual capacity and the discharged capacity;

calculating, by the processing circuit, an expected backup time ($T_{expected}$) that the battery can support, according to $T_{expected} = (T_2 + (C_{remain}/I_{average}))^*k$, wherein $C_{remain}$ is the remaining capacity, $I_{average}$ is the average discharge current, and k is an aging factor indicating the age of the battery;

comparing, by the processing circuit, the predicted backup time and the expected backup time; and if the expected backup time is less than or equal to the predicted backup time, determining that the battery is in an EOL state.

2. The method of claim 1, further comprising the step of indicating the EOL state of the battery.

3. The method of claim 1, wherein computing the predicted backup time comprises linear extrapolation of voltage over time values based on the first and the second discharge voltage values and the first and second points in time and calculating the predicted backup time as a third point in time when a predicted discharge voltage value is equal to a predetermined minimum voltage.

4. The method of claim 1, wherein computing the expected backup time further comprises calculating the expected backup time by dividing the remaining capacity by the average discharge current and adding the result to the second point in time.

5. The method of claim 1, the method further comprising the step of initiating the discharge of the battery.

6. The method of claim 1, wherein computing the average discharge current further comprises:
comparing the average discharge current to a discharge current threshold value and if the average discharge current is below the discharge current threshold value then terminating the method.

7. An arrangement for determining an end-of-life (EOL) state of a battery, the battery having an initial capacity, the arrangement comprising:

a measuring circuit configured to measure a first discharge voltage value provided by the battery at a first point of time and a second discharge voltage value provided by the battery at a second point of time $T_2$; and a processing circuit configured to compute a predicted backup time that the battery can support, based on the first and second discharge voltage values and the first and second points in time;

wherein the measuring part is further configured to measure a plurality of discharge current values at a plurality of points of time on or between the first point of time and the second point of time; and wherein the processing circuit is further configured to:

compute an average discharge current from the plurality of discharge current values;

calculate a discharged capacity by multiplying the average discharge current by a difference between the second and first points in time;

calculate an actual capacity of the battery before the discharge, based on the initial capacity and the average discharge current;

calculate a remaining capacity after discharge according to a difference between the actual capacity and the discharged capacity;

calculating an expected backup time ($T_{expectected}$) that the battery can support, according to $T_{expected} = (T_2 + (C_{remain}/I_{average}))^*k$, wherein $C_{remain}$ is the remaining capacity, $I_{average}$ is the average discharge current, and k is an aging factor indicating the age of the battery;

compare the predicted backup time and the expected backup time; and if the expected backup time is less than or equal to the predicted backup time, determine that the battery is in an EOL state.

8. The arrangement of claim 7, further comprising an indicating circuit configured to indicate the EOL state of the battery.

9. A network node in a wireless telecommunication network comprising the arrangement of claim 7.

10. The network node of claim 9, whereby the network node is a base transceiver station, a radio base station, a Node B, an eNode B, a base station controller or a radio network controller.

11. A non-transitory computer readable medium storing a computer program for determining an end-of-life (EOL) state of a battery, the battery having an initial capacity, the computer program comprising computer program segments that, when executed by a computer, cause the computer to:

compute, by a processing circuit, a predicted backup time that the battery can support, based on measured values of a first discharge voltage, by a measuring circuit, provided by the battery at a first point of time and a second discharge voltage, by a measuring circuit, provided by the battery at a second point of time $T_2$;

during the discharge, measuring, by the measuring circuit, a plurality of discharge current values at a plurality of points of time on or between the first point of time and the second point of time;

compute, by the processing circuit, an average discharge current from a plurality of measured discharge current values;

calculate, by the processing circuit, a discharged capacity by multiplying the average discharge current by a difference between the second and first points in time;

calculate, by the processing circuit, an actual capacity of the battery before the discharge, based on the initial capacity and the average discharge current;

calculate, by the processing circuit, a remaining capacity after discharge according to a difference between the actual capacity and the discharged capacity;

calculating, by the processing circuit, an expected backup time ($T_{expected}$) that the battery can support, according to $T_{expected}=(T_2+(C_{remain}/I_{average}))*k$, wherein $C_{remain}$ is the remaining capacity, $I_{average}$ is the average discharge current, and k is an aging factor indicating the age of the battery;

comparing, by the processing circuit, the expected backup time and the predicted backup time; and, if the expected backup time is less than or equal to the predicted backup time, determine the EOL state of the battery.

12. The non-transitory computer-readable medium of claim 11, wherein the computer program further comprises computer program segments configured to cause the computer to indicate the EOL state of the battery.

* * * * *